(12) United States Patent
Park (10) Patent No.: US 8,249,200 B2
(45) Date of Patent: Aug. 21, 2012

(54) METHOD AND APPARATUS OF BINARIZING INPUT SIGNAL, DISC DRIVER AND RECORDING MEDIUM

(75) Inventor: Hyun-Soo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 661 days.

(21) Appl. No.: 12/306,040

(22) PCT Filed: Jun. 4, 2007

(86) PCT No.: PCT/KR2007/002688
§ 371 (c)(1),
(2), (4) Date: Dec. 22, 2008

(87) PCT Pub. No.: WO2008/013361
PCT Pub. Date: Jan. 31, 2008

(65) Prior Publication Data
US 2009/0202023 A1    Aug. 13, 2009

(30) Foreign Application Priority Data

Jul. 27, 2006  (KR) .................. 10-2006-0070888

(51) Int. Cl.
*H04L 27/06* (2006.01)
*H04L 7/00* (2006.01)
*G01S 1/00* (2006.01)
(52) U.S. Cl. ............. 375/341; 375/366; 342/350
(58) Field of Classification Search .......... 375/341, 375/366; 342/350
See application file for complete search history.

(56) References Cited

U.S. PATENT DOCUMENTS

| | | | | |
|---|---|---|---|---|
| 5,949,831 | A | * | 9/1999 | Coker et al. ............ 375/341 |
| 6,011,508 | A | * | 1/2000 | Perreault et al. ......... 342/350 |
| 6,118,833 | A | * | 9/2000 | Bergmans et al. ........ 375/366 |
| 6,222,808 | B1 | | 4/2001 | Kagawa |

(Continued)

FOREIGN PATENT DOCUMENTS

| | | |
|---|---|---|
| JP | 11-120702 A | 4/1999 |
| JP | 11-339395 A | 12/1999 |
| JP | 2001-256736 A | 9/2001 |

(Continued)

OTHER PUBLICATIONS

Japanese Office Action issued Oct. 18, 2011, in counterpart Japanese Application No. 2009-521690 (3 pp. including English translation).

*Primary Examiner* — David C. Payne
*Assistant Examiner* — Sarah Hassan
(74) *Attorney, Agent, or Firm* — NSIP Law (57) ABSTRACT

A method and an apparatus are provided for binarizing an input signal, which is capable of reliably correcting an offset of the input signal even when the input signal does not reach a reference level or has a single frequency, a disc driver and a recording medium. The binarizing method includes viterbi-decoding the input signal to obtain a viterbi-decoded signal; slicing the input signal based on a predetermined reference level to obtain a sliced signal; obtaining an offset of the input signal by low-pass filtering the viterbi-decoded signal or the sliced signal; and correcting the offset of the input signal based on the obtained offset. The viterbi-decoded signal is a binary signal of the input signal.

19 Claims, 9 Drawing Sheets

U.S. PATENT DOCUMENTS

| | | | |
|---|---|---|---|
| 6,381,085 B1 * | 4/2002 | Du et al. | 360/65 |
| 6,559,838 B1 * | 5/2003 | Lonoce et al. | 345/212 |
| 6,754,160 B2 | 6/2004 | Kashihara et al. | |
| 6,798,363 B2 | 9/2004 | Rapp | |
| 6,977,970 B2 | 12/2005 | Shim et al. | |
| 7,339,988 B1 * | 3/2008 | Shanbhag et al. | 375/232 |
| 2002/0001354 A1 * | 1/2002 | McNally | 375/317 |
| 2002/0067784 A1 * | 6/2002 | Bowler | 375/354 |
| 2002/0196844 A1 * | 12/2002 | Rafie et al. | 375/232 |
| 2003/0016770 A1 * | 1/2003 | Trans et al. | 375/346 |
| 2003/0182664 A1 * | 9/2003 | Lusky et al. | 725/111 |
| 2005/0123077 A1 * | 6/2005 | Kim | 375/342 |

FOREIGN PATENT DOCUMENTS

| | | |
|---|---|---|
| JP | 2003-196838 A | 7/2003 |
| JP | 2004-281029 A | 10/2004 |
| KR | 2004-92763 | 11/2004 |
| KR | 2004-107778 | 12/2004 |
| KR | 2004-110090 | 12/2004 |

\* cited by examiner

METHOD AND APPARATUS OF BINARIZING INPUT SIGNAL, DISC DRIVER AND RECORDING MEDIUM

CROSS-REFERENCE TO RELATED APPLICATIONS

This application claims the benefit of PCT International Patent Application No. PCT/KR2007/002688, filed Jun. 4, 2007, and Korean Patent Application No. 2006-70888, filed Jul. 27, 2006, in the Korean Intellectual Property Office, the disclosures of which are incorporated herein by reference.

BACKGROUND OF THE INVENTION

1. Field of the Invention

Aspects of the present invention relate to binarization of an input signal, and more particularly, to a binarizing apparatus and method which is capable of correcting an offset of an input signal, a disc driver which includes the binarizing apparatus or performs the binarizing method, and a recording medium thereof.

2. Description of the Related Art

Figure 1:
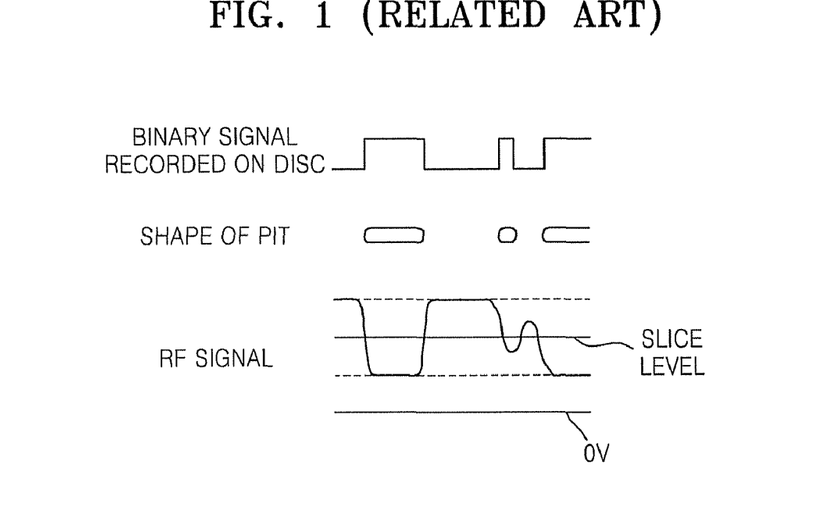
FIG. 1 shows a binary signal recorded on a disc, the shape of a pit and the pattern of an RF signal.

A binary signal called a pit is recorded on the surface of a disc. A radio frequency (RF) signal read by irradiating a laser beam onto the surface of the disc has an analog signal property due to optical frequency characteristics and frequency characteristics of a circuit. An example of a binary signal recorded on a disc, the shape of a pit recorded on the surface of the disc, and the RF signal read from the disc is shown in FIG. 1.

Figure 2:
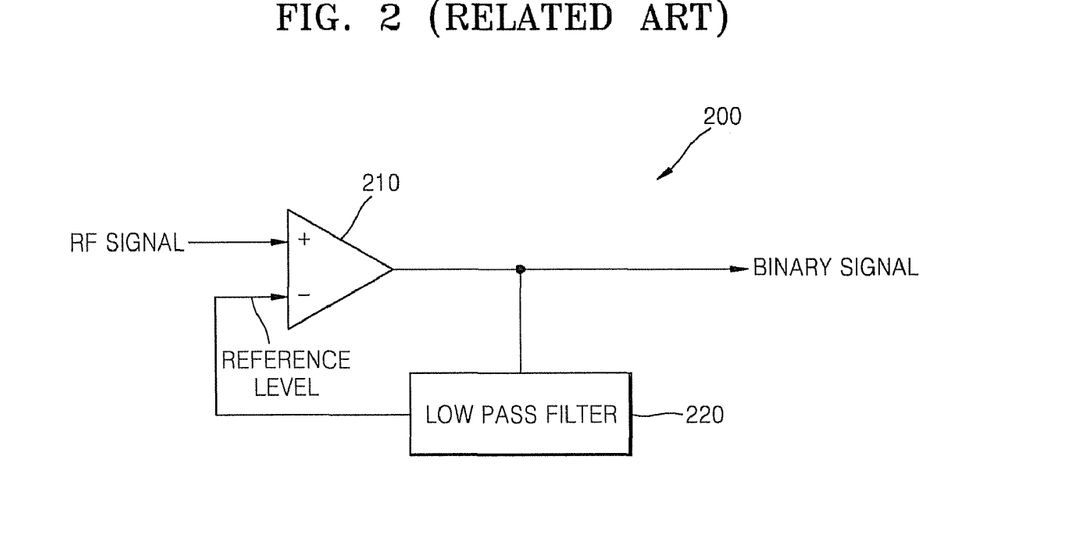
FIG. 2 is a circuit diagram showing a general circuit for binarizing an input signal.

Various methods of converting the RF signal to the binary signal have been suggested. As a representative example, a binarizing circuit 200 is shown in FIG. 2. The binarizing circuit 200 shown in FIG. 2 includes a comparator 210 and a low pass filter 220. The comparator 210 compares an input RF signal with a reference level (or slice level) and outputs the result of the comparison as a binary signal of the input RF signal. The reference level is supplied from the low pass filter 220 which low-pass filters the binary signal output from the comparator 210. The low pass filter 220 outputs a DC component of the binary signal output from the comparator 210. The signal output from the low pass filter 220 is supplied as the reference level.

Figure 3:
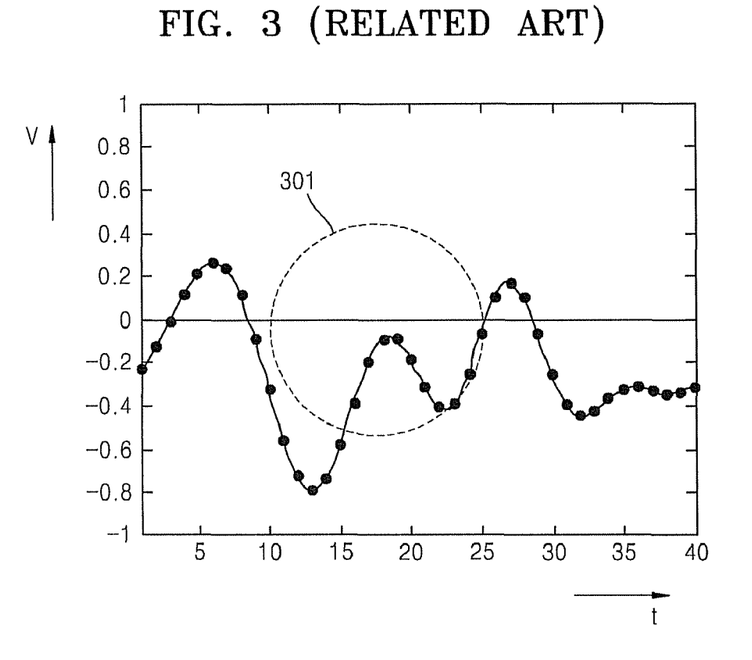
FIG. 3 shows an example of an RF signal read from a high-density disc.

However, as the density of the disc increases, the amplitude of a high frequency signal in the RF signal read from the disc decreases. Thus, a high frequency signal having a level lower than the reference level of the comparator 210 may be generated. For example, as shown in a portion 301 of FIG. 3, an RF signal in which zero-crossing does not properly occur may be generated. FIG. 3 is an example of an RF signal read from a high-density disc having a resolution of higher than a resolution of a system clock. The portion 301 of FIG. 3 shows an RF signal of a pit having a run-length of 2 T or 3 T and a previous pit having a long run-length. The RF signal in which the zero-crossing does not properly occur, as shown in the portion 301 of FIG. 3, corresponds to the high frequency signal having a level lower than the reference level.

When the input RF signal does not reach the reference level, it is impossible to obtain a stable binary signal.

Figure 4:
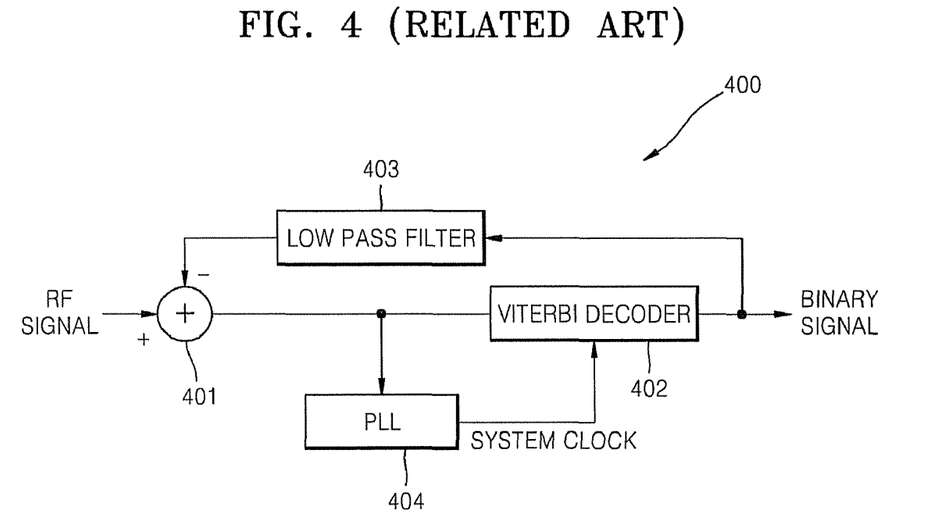
FIG. 4 is a functional block diagram of a conventional apparatus to binarize an input signal.

In order to solve this problem, as shown in FIG. 4, a binarizing apparatus 400 to correct an offset of an input signal using a viterbi decoder 402 was suggested. In the binarizing apparatus 400 shown in FIG. 4, a subtractor 401 subtracts a reference level (or a slice level) from an input RF signal in order to obtain an RF signal from which a DC offset is removed.

The viterbi decoder 402 viterbi-decodes the RF signal from which the DC offset is removed so as to obtain a binary signal. A low pass filter 402 low-pass filters the binary signal obtained by the viterbi decoder 402 in order to supply the low-pass filtered binary signal as a reference level. A phase lock loop (PLL) 404 generates a system clock using the RF signal from which the DC offset is removed. The generated system clock is supplied to the viterbi decoder 402. The viterbi decoder 402 decodes the input RF signal in synchronization with the system clock. It is possible to obtain a stable binary signal even when the RF signal read from the high-density disc does not reach the reference level.

Figure 5A:
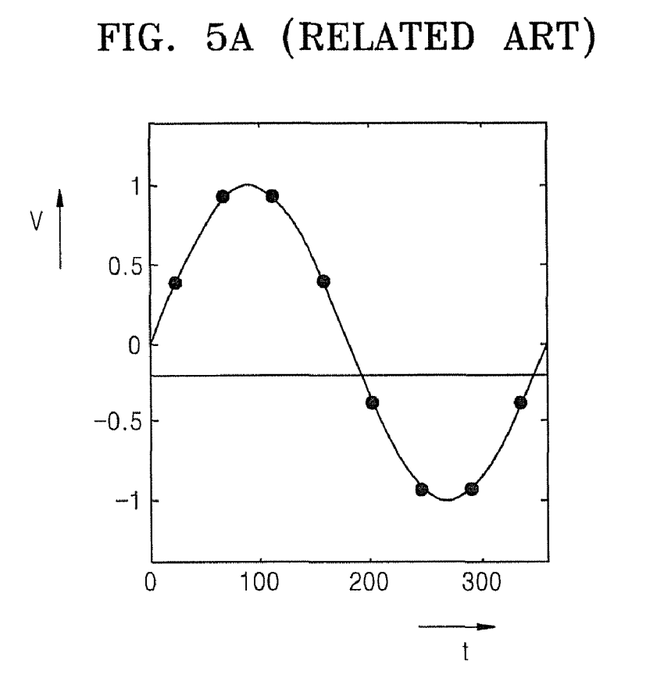
FIGS. 5A, 5B and 5C show the wavelengths of input signals having different DC offsets.
Figure 5B:
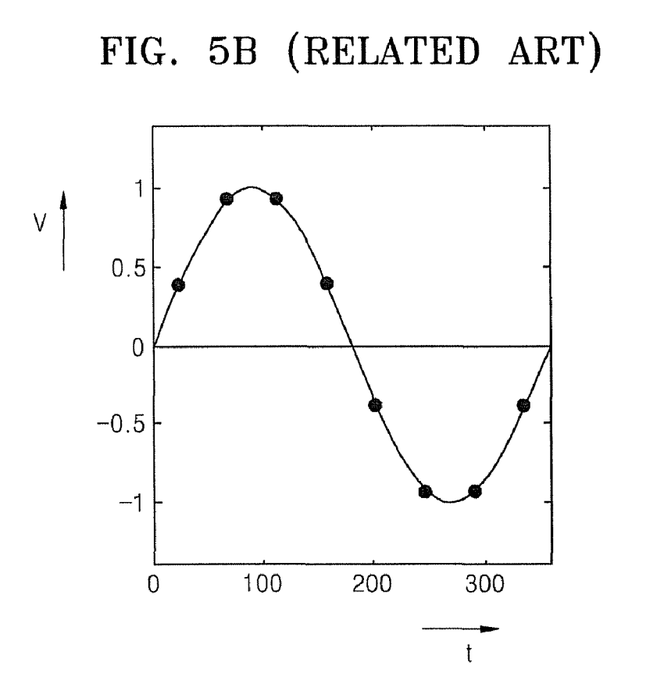
Figure 5C:
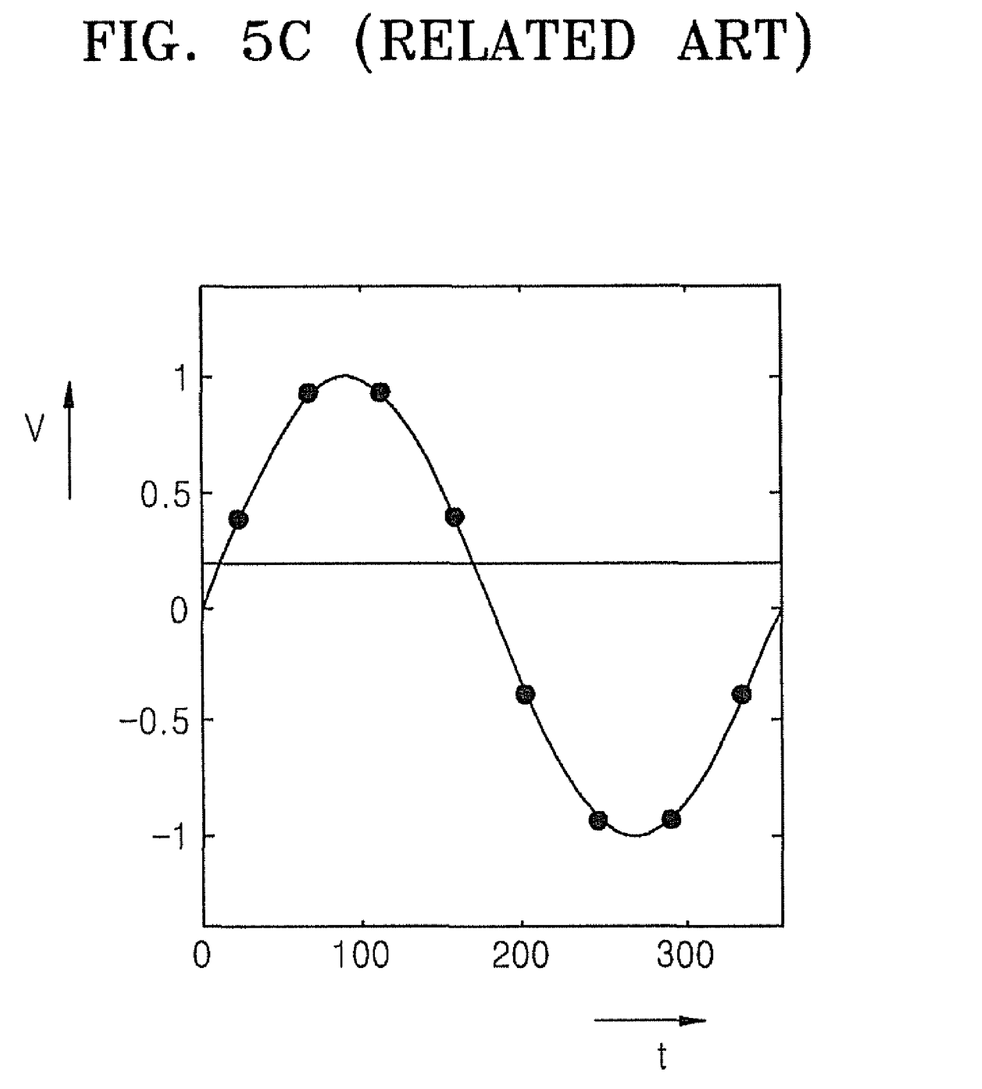

However, the binarizing apparatus 400 shown in FIG. 4 cannot reliably remove the DC offset, when the RF signal having a single frequency, as shown in FIG. 5 a through 5C, is input. Although respective input signals having different DC offsets, as shown in FIGS. 5A, 5B and 5C, are input, the viterbi decoder 402 outputs the same value "11110000". In the case of the input signals shown in FIGS. 5A, 5B and 5C, since the signals input to the low pass filter 403 are the same, the outputs of the low pass filter 403 are the same. Therefore, since the same DC offset is output with respect to the three input signals, the offset is not corrected.

SUMMARY OF THE INVENTION

Aspects of the present invention provide a method and apparatus of binarizing an input signal, which is capable of reliably correcting an offset of the input signal even when the input signal does not reach a reference level or has a single frequency.

Additional aspects of the present invention provide a disc driver which includes a binarizing apparatus or performs a binarizing method and a computer-readable recording medium having recorded thereon a computer program for performing the binarizing method.

According to aspects of the present invention, since an offset of an input signal can be reliably corrected even when the input signal does not reach a reference level or has a single frequency, it is possible to improve the stability and the performance of a system.

According to an aspect of the present invention, a method of binarizing an input signal is provided. The method includes viterbi-decoding the input signal to obtain a viterbi-decoded signal; slicing the input signal based on a predetermined reference level to obtain a sliced signal; obtaining an offset of the input signal by low-pass filtering the viterbi-decoded signal or the sliced signal; and correcting the offset of the input signal based on the obtained offset, wherein the viterbi-decoded signal is a binary signal of the input signal.

According to another aspect of the present invention, an apparatus to binarize an input signal is provided. The apparatus includes a viterbi-decoder to viterbi-decode the input signal; a slicer to slice the input signal based on a predetermined reference level; a low pass filter module to low-pass filter an output signal of the viterbi decoder or an output signal of the slicer; an offset correcting module to remove an output signal of the low pass filter module from the input signal, to correct an offset of the input signal and to supply the input signal with the corrected offset to the viterbi decoder and the slicer, wherein the output signal of the viterbi decoder is a binary signal of the input signal.

According to another aspect of the present invention, a disc driver having a function to binarize an RF (radio frequency) signal read from a disc is provided. The disc driver includes a viterbi decoder to viterbi-decode the RF signal read from the disc; a slicer to slice the RF signal using a predetermined reference level; a low pass filter module to low-pass filter a signal output from the viterbi decoder or a signal output from the slicer; and an offset correcting module to remove a signal output from the low pass filter module from the RF signal, to correct an offset of the RF signal, and to provide the RF signal with the corrected offset to the viterbi decoder and the slicer, wherein the signal output from the viterbi decoder is a binary signal of the RF signal.

According to another aspect of the present invention, a computer-readable recording medium is provided, having embodied thereon a computer program to perform a method of binarizing an input signal. The method includes viterbi-decoding the input signal to obtain a viterbi-decoded signal; slicing the input signal based on a predetermined reference level to obtain a sliced signal; low-pass filtering the viterbi-decoded signal or the sliced signal to obtain an offset of the input signal; and correcting the offset of the input signal based on the obtained offset, wherein the viterbi-decoded signal is a binary signal of the input signal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 6:
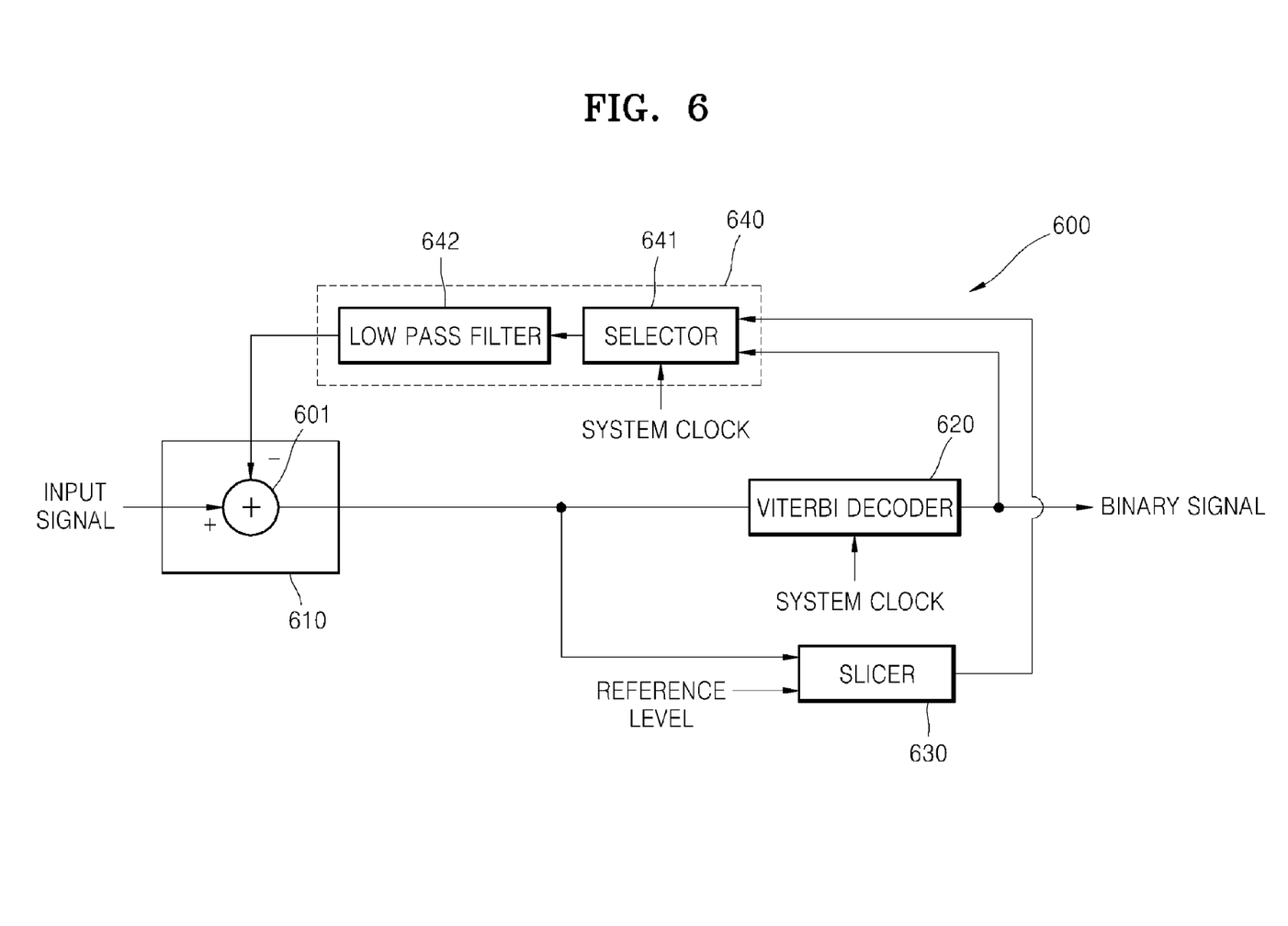
FIG. 6 is a functional block diagram of an apparatus to binarize an input signal according to an example embodiment of the present invention.

FIG. 6 is a functional block diagram of an apparatus 600 to binarize an input signal according to an embodiment of the present invention. Referring to FIG. 6, the binarizing apparatus 600 includes an offset correcting module 610, a viterbi decoder 620, a slicer 630 and a low pass filter module 640. According to other aspects of the present invention, the apparatus 600 may include additional and/or different units. Similarly, the functionality of two or more of the above units may be integrated into a single component. The input signal may be any signal to be binarized, such as a signal reproduced from a recording medium or a wired or wireless network.

The offset correcting module 610 removes an output signal of the low pass filter module 640 from the input signal in order to correct an offset of the input signal. The offset correcting module 610 may include a subtractor 601. The subtractor 601 subtracts the output signal of the low pass filter module 640 from the input signal in order to remove the offset of the input signal. The offset correcting module 610 can be defined as an offset removing module. The offset correcting module 610 transmits the input signal having the corrected offset to the viterbi decoder 620 and the slicer 630.

The viterbi decoder 620 viterbi-decodes the input signal having the corrected offset. The signal output from the viterbi decoder 620 is a binary signal of the input signal. The viterbi decoder 620 viterbi-decodes the input signal in synchronization with a system clock. Accordingly, it is possible to obtain a stable binary signal even when the input signal is an RF signal read from a high-density disc and does not reach a reference level.

The slicer 630 slices the input signal using a predetermined reference level. The predetermined reference level may be set to 0 V, since the signal input to the slicer 630 is a signal from which a DC offset is removed. However, any predetermined reference level may be used. The slicer 630 may include a circuit (for example, a comparator circuit) to determine whether the input signal is 0 or 1 based on the predetermined reference level.

The low pass filter module 640 low-pass filters either the output signal of the viterbi decoder 620 or the output signal of the slicer 630. The low pass filter module 640 includes a selector 641 and a low pass filter 642. The selector 641 selects one of the output signal of the viterbi decoder 620 and the output signal of the slicer 630 in synchronization with the system clock.

Figure 7:
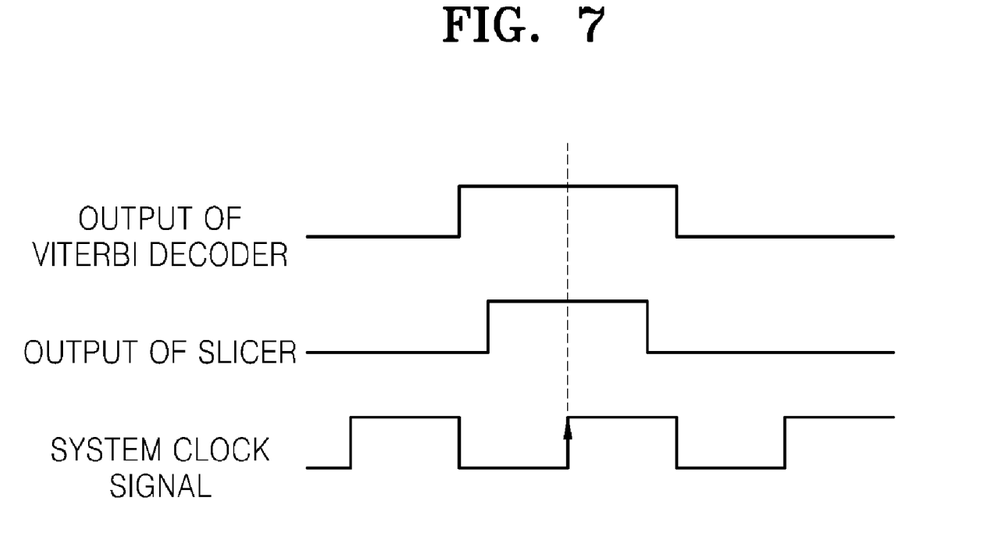
FIG. 7 shows an example of the wavelengths of output signals in the apparatus illustrated in FIG. 6.

The selector 641 compares the output signal of the viterbi decoder 620 with the output signal of the slicer 630. If the output signal of the viterbi decoder 620 is identical to the output signal of the slicer 630, the selector 641 selects and outputs the output signal of the slicer 630. As shown in FIG. 7, when the output signal of the viterbi decoder 620 is identical to the output signal of the slicer 630 at a rising edge of the system clock signal, the selector 641 selects and outputs the output signal of the slicer 630. FIG. 7 shows the wavelengths of the output signal of the viterbi decoder 620, the output signal of the slicer 630 and the system clock signal of the apparatus shown in FIG. 6. If the input signal has a single frequency, as shown in FIGS. 5A through 5C, the selector 641 selects the output signal of the slicer 630. The input signal here has a resolution lower than a resolution of the system clock.

Figure 8:
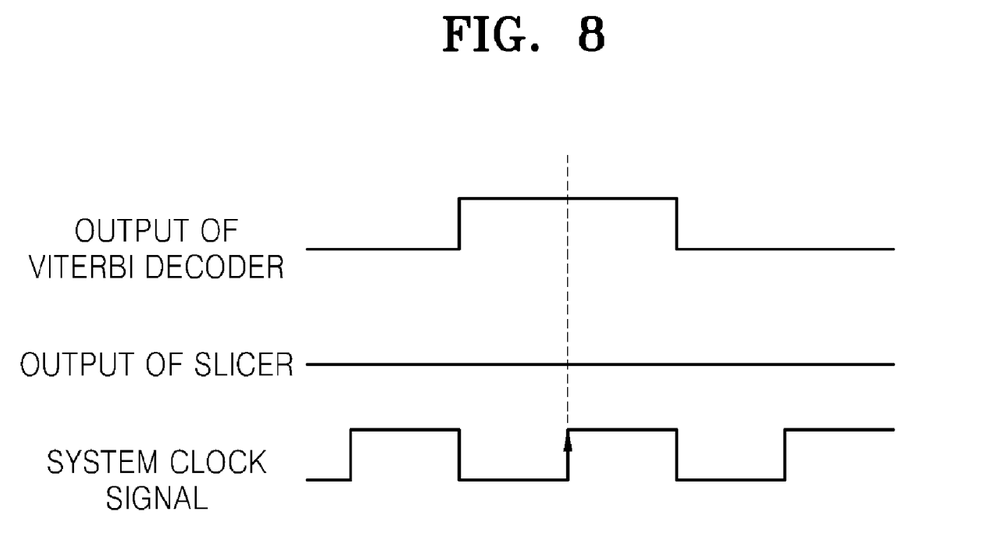
FIG. 8 shows another example of the wavelengths of the output signals in the apparatus illustrated in FIG. 6.

If the output signal of the viterbi decoder 620 is not identical to the output signal of the slicer 630, the selector 641 selects and outputs the output signal of the viterbi decoder 620. As shown in FIG. 8, when the output signal of the viterbi decoder 620 is not identical to the output signal of the slicer 630 at the rising edge of the system clock signal, the selector 641 selects and outputs the output signal of the viterbi decoder 620. FIG. 8 shows the wavelengths of the output signal of the viterbi decoder 620, the output signal of the slicer 630 and the system clock signal of the apparatus shown in FIG. 6. When the input signal does not reach the reference level as shown in FIG. 3, the selector 641 selects the output signal of the viterbi decoder 620. The input signal here has a resolution higher than the resolution of the system clock.

The low pass filter 642 low-pass filters the signal output from the selector 641. The low-pass filtered signal is supplied to the offset correcting module 610. The low-pass filtered signal is the offset of the input signal. Accordingly, the low pass filter module 640 can be defined as a module to obtain the offset of the input signal.

Figure 9:
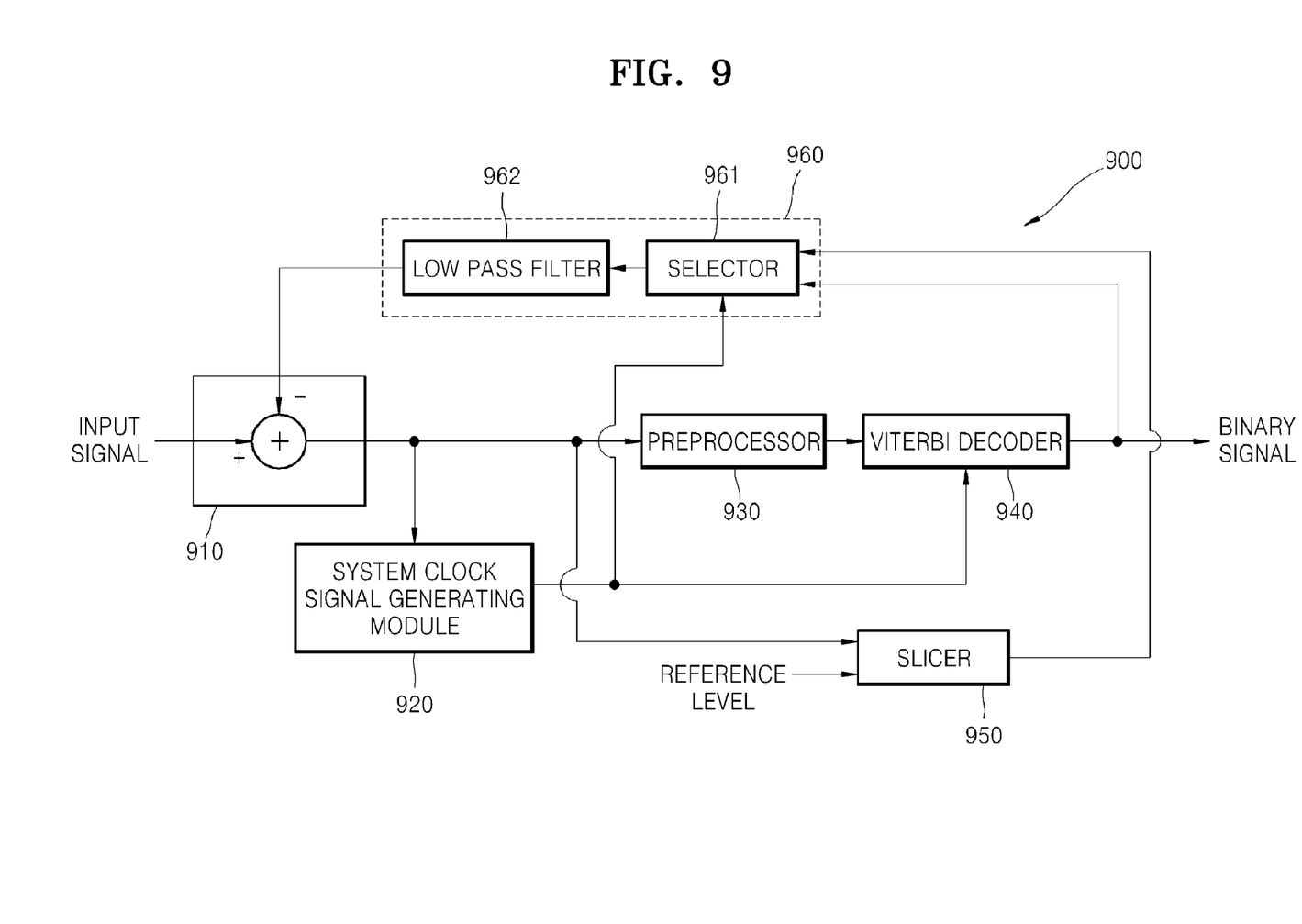
FIG. 9 is a functional block diagram of an apparatus to binarize an input signal according to an example embodiment of the present invention.

FIG. 9 shows an apparatus 900 to binarize an input signal according to an example embodiment of the present invention. The binarizing apparatus 900 includes an offset correcting module 910, a system clock signal generating module 920, a preprocessor 930, a viterbi decoder 940, a slicer 950 and a low pass filter module 960.

The offset correcting module 910, the viterbi decoder 940, the slicer 950, and the low pass filter module 960 shown in FIG. 9 are similar to the offset correcting module 610, the viterbi decoder 620, the slicer 630, and the low pass filter module 640, respectively, as shown in FIG. 6, in terms of configuration and operation.

The system clock signal generating module 920 generates a system clock signal using the input signal having a corrected offset, which is output from the offset correcting module 910. The system clock signal generating module 920 may include a phase lock loop (PLL) circuit. The system clock signal generating module 920 supplies the generated system clock to the viterbi decoder 940 and the low pass filter module 960. Accordingly, the viterbi decoder 940 and the low pass filter module 960 are driven in synchronization with the system clock signal generated using the input signal having the corrected offset.

The preprocessor 930 converts the signal output from the offset correcting module 910 into a signal having a shape necessary for the viterbi decoder 940. The preprocessor 930 may include an equalizer to improve the performance of the viterbi decoder 940.

The binarizing apparatuses 600 and 900 shown in FIGS. 6 and 9 may be included in a disc driver. When the binarizing apparatuses 600 and 900 are included in the disc driver, the input signals are the RF signals read from the disc.

Figure 10:
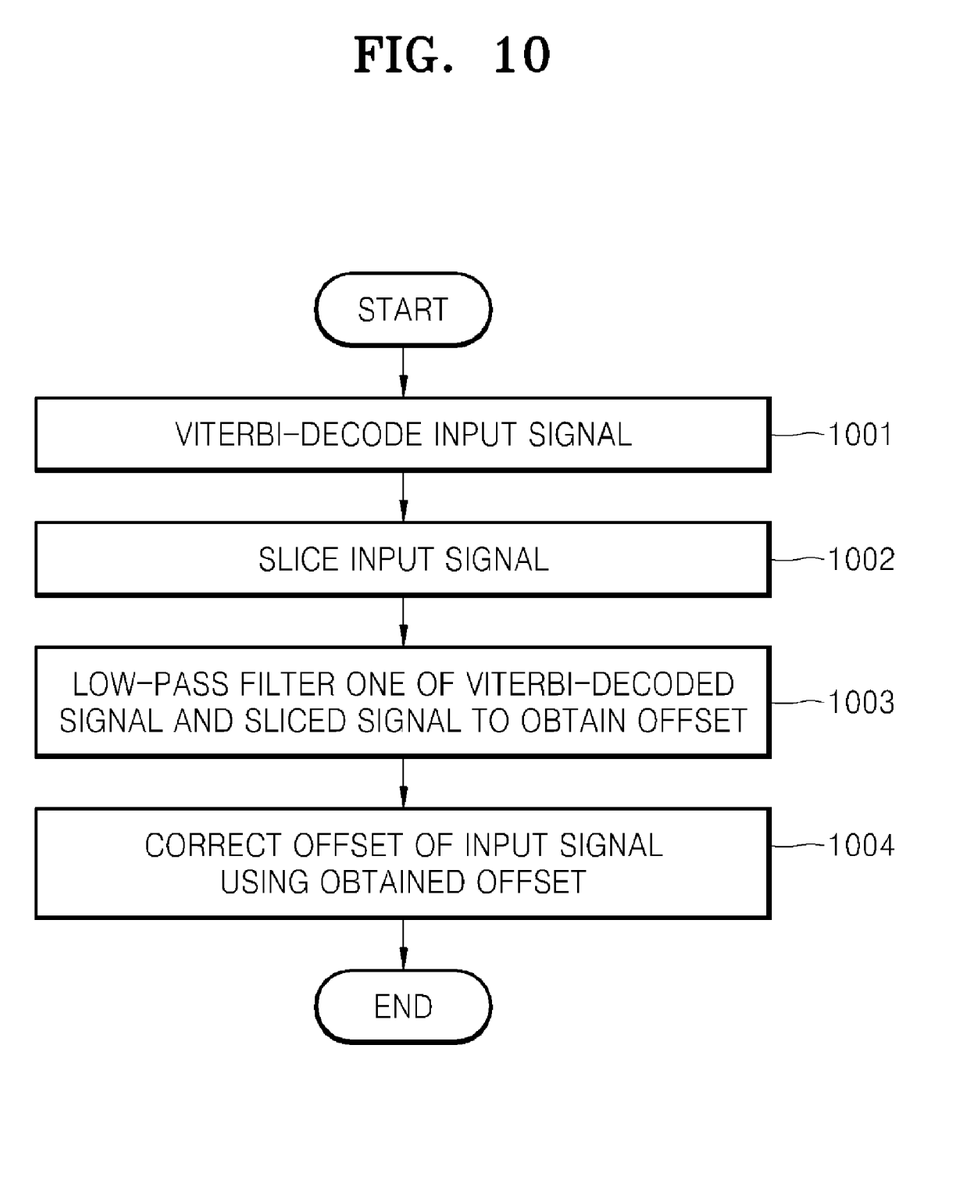
FIG. 10 is a flowchart of a process of binarizing an input signal according to an example embodiment of the present invention.

FIG. 10 is a flowchart of a process of binarizing an input signal according to an example embodiment of the present invention.

An input signal is viterbi-decoded at block 1001. The viterbi decoding is performed in synchronization with a system clock. The system clock is generated based on the input signal from which an offset is removed. A binary signal of the input signal is obtained by the viterbi decoding. Before the input signal is viterbi-decoded, the input signal may be subjected to a preprocessing operation to convert the input signal into a signal having a shape necessary for the viterbi decoding. The preprocessing operation may be defined as an operation to equalize the input signal.

The input signal is sliced based on a predetermined reference level at block 1002. The predetermined reference level is similar to that described in the slicer 630 shown in FIG. 6. The input signal, which will be viterbi-decoded or sliced, is subjected to an offset correcting operation at block 1104.

Figure 11:
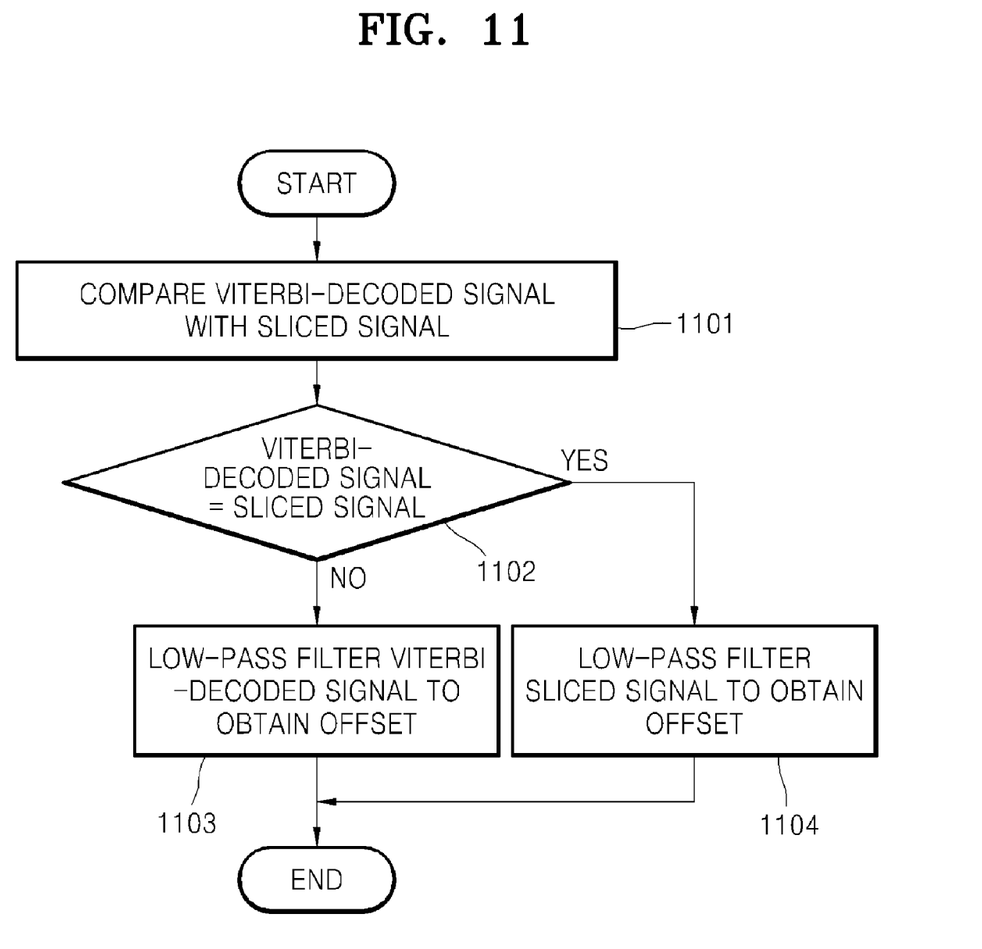
FIG. 11 is a flowchart showing in detail an operation to obtain an offset of an input signal in the method of binarizing the input signal according to an example embodiment of the present invention.

Any one of the viterbi-decoded signal and the sliced signal is low-pass filtered in order to obtain an offset of the input signal at block 1003. The operation of obtaining the offset of the input signal is shown in FIG. 11. FIG. 11 is a flowchart showing in detail block 1003 to obtain the offset of an input signal in the binarizing process shown in FIG. 10.

Referring to FIG. 11, the viterbi-decoded signal and the sliced signal are compared at block 1101. The comparison is performed in synchronization with the system clock. If the viterbi-decoded signal is not identical to the sliced signal, the viterbi-decoded signal is low-pass filtered in order to obtain the offset at blocks 1102 and 1103. If the viterbi-decoded signal is identical to the sliced signal, the sliced signal is low-pass filtered in order to obtain the offset of the input signal at blocks 1102 and 1104.

When the offset of the input signal is obtained, the offset of the input signal is corrected using the obtained offset at block 1004 of FIG. 10.

Aspects of the present invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CDs, DVDs, Blu-ray discs, magnetic tapes, floppy disks, and optical data storage devices. Aspects of the present invention may also be embodied as carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. A method of binarizing an input signal, comprising:
    viterbi-decoding the input signal;
    slicing the input signal based on a predetermined reference level;
    comparing the viterbi-decoded signal with the sliced signal;
    determining which of the viterbi-decoded signal and the sliced signal to perform processing on so as to obtain an offset of the input signal, the determining being based on relative characteristics of the viterbi-decoded signal and the sliced signal;
    obtaining an offset of the input signal; and
    correcting the offset of the input signal based on the obtained offset;
    wherein the viterbi-decoded signal is a binary signal of the input signal.

2. The method of claim 1, wherein the obtaining of the offset comprises:
    low-pass filtering the viterbi-decoded signal to obtain the offset if the viterbi-decoded signal is not identical to the sliced signal; and
    low-pass filtering the sliced signal to obtain the offset if the viterbi-decoded signal is identical to the sliced signal.

3. The method of claim 1, wherein the comparing of the viterbi-decoded signal with the sliced signal is performed in synchronization with a system clock.

4. The method of claim 3 wherein the system clock is generated based on the input signal from which the offset is removed.

5. The method of claim 1, wherein the input signal, which will be viterbi-decoded or sliced, is subjected to the offset correction.

6. The method of claim 1, wherein the viterbi-decoding of the input signal further comprises pre-processing the input signal into a signal for the viterbi decoding.

7. The method of claim 6, wherein the pre-processing of the input signal comprises equalizing the input signal.

8. An apparatus to binarize an input signal, comprising:
a viterbi-decoder to viterbi-decode the input signal;
a slicer to slice the input signal based on a predetermined reference level;
a selector to select which of the output of the viterbi-decoder and the output of the slicer to filter, the selecting being based on relative characteristics of the output of the viterbi-decoder and the output of the slicer;
a low pass filter module to low-pass filter the selected signal output from the selector;
an offset correcting module to remove an output signal of the low pass filter module from the input signal, to correct an offset of the input signal, and to supply the input signal with the corrected offset to the viterbi decoder and the slicer;
wherein the output signal of the viterbi decoder is a binary signal of the input signal.

9. The apparatus of claim 8, wherein the selector selects and outputs the output signal of the slicer when the output signal of the viterbi decoder is identical to the output signal of the slicer, and selects and outputs the output signal of the viterbi decoder when the output signal of the viterbi decoder is not identical to the output signal of the slicer.

10. The apparatus of claim 8, further comprising a system clock signal generating module to generate a system clock signal using the signal output from the offset correcting module and to supply the system clock signal to the viterbi decoder and the low pass filter module.

11. The apparatus of claim 8, further comprising a preprocessor to convert the signal output from the offset correcting module into a signal having a shape necessary for the viterbi decoder.

12. A disc driver having a function of binarizing an RF (radio frequency) signal read from a disc, the disc driver comprising:
a viterbi decoder to viterbi-decode the RF signal read from the disc;
a slicer to slice the RF signal using a predetermined reference level;
a selector that select which of the output of the viterbi-decoder and the output of the slicer to filter, the selecting being based on relative characteristics of the output of the viterbi-decoder and the output of the slicer; a low pass filter module to low-pass filter the selected signal output from the selector; an offset correcting module to remove a signal output from the low pass filter module from the RF signal, to correct an offset of the RF signal, and to provide the RF signal with the corrected offset to the viterbi decoder and the slicer;
wherein the signal output from the viterbi decoder is a binary signal of the RF signal.

13. A non-transitory computer-readable recording medium having embodied thereon a computer program to perform a method of binarizing an input signal, the method comprising:
viterbi-decoding the input signal to obtain a viterbi-decoded signal;
slicing the input signal based on a predetermined reference level to obtain a sliced signal;
comparing the viterbi-decoded signal with the sliced signal;
determining which of the viterbi-decoded signal and the sliced signal to perform processing on so as to obtain an offset of the input signal, the determining being based on relative characteristics of the viterbi-decoded signal and the sliced signal; low-pass filtering the viterbi-decoded signal or the sliced signal to obtain an offset of the input signal; and
correcting the offset of the input signal using the obtained offset;
wherein the viterbi-decoded signal is a binary signal of the input signal.

14. The method of claim 1, wherein the obtaining of the offset of the input signal comprises:
low-pass filtering the viterbi-decoded input signal so as to obtain the offset of the input signal, if the viterbi-decoded input signal is not identical to the sliced input signal;
low-pass filtering the sliced input signal so as to obtain the offset of the input signal, if the viterbi-decoded input signal is identical to the sliced input signal.

15. The method of claim 14, further comprising:
binarizing the input signal based on the corrected offset, so as to generate an output signal.

16. The method of claim 1, wherein:
the viterbi-decoding of the input signal is performed based on a system clock signal;
the slicing the input signal is performed based on the predetermined reference level and the system clock signal; and
the obtaining of the offset of the input signal comprises:
low-pass filtering the viterbi-decoded input signal so as to obtain the offset of the input signal, if a resolution of the input signal is higher than a resolution of the system clock signal; and
low-pass filtering the sliced input signal so as to obtain the offset of the input signal, if the resolution of the input signal is not higher than the resolution of the system clock signal.

17. The method of claim 16, wherein the system clock signal is generated based on the corrected input signal.

18. The method of claim 16, wherein:
the low-pass filtering of the viterbi-decoded input signal is synchronized with the system clock signal; and
the low-pass filtering of the sliced input signal is synchronized with the system clock signal.

19. The method of claim 16, further comprising binarizing the input signal based on the corrected offset, so as to generate an output signal.

* * * * *